United States Patent [19]

Elmer

[11] Patent Number: 4,740,919
[45] Date of Patent: Apr. 26, 1988

[54] ELECTRICALLY PROGRAMMABLE LOGIC ARRAY

[75] Inventor: Werner Elmer, Moosburg, Fed. Rep. of Germany

[73] Assignee: Texas Instruments Incorporated, Dallas, Tex.

[21] Appl. No.: 846,329

[22] Filed: Mar. 31, 1986

[30] Foreign Application Priority Data

Jun. 4, 1985 [DE] Fed. Rep. of Germany ....... 3520003

[51] Int. Cl.$^4$ ............................................. G11C 11/40
[52] U.S. Cl. ...................................... 365/104; 365/94; 365/103
[58] Field of Search .................. 369/94, 103, 104, 105

[56] References Cited

U.S. PATENT DOCUMENTS 3,721,964 3/1973 Barrett ................................. 365/103
4,237,547 12/1980 Smith ................................... 365/103

*Primary Examiner*—Terrell W. Fears
*Attorney, Agent, or Firm*—Gary Honeycutt; Melvin Sharp; Rhys Merrett

[57] ABSTRACT

An electrically programmable logic array (10) for binary signals having signal inputs ($A_0$–$A_x$) and signal outputs ($Q_0$–$Q_i$) comprises two row lines ($a_0, a_0'$–$a_x, a_x'$) for each signal input. The signal applied to the signal input is generatable at the one row line in non-negated form and at the other row line in negated form. For each signal output a column line ($q_0$–$q_i$) is provided.

In the non-programmable state between each row line and each column line there is an electrically conductive connection interruptable for the purpose of programming. Inserted into the connection between the signal inputs and each associated row line is a controllable switching member ($S_0, S_{0'}$,–$S_x, S_{x'}$) which is controllable by a control signal applied thereto in such a manner that its output signal changes with the signal applied to the associated signal input or irrespective of said signal always retains a predetermined signal value.

2 Claims, 1 Drawing Sheet

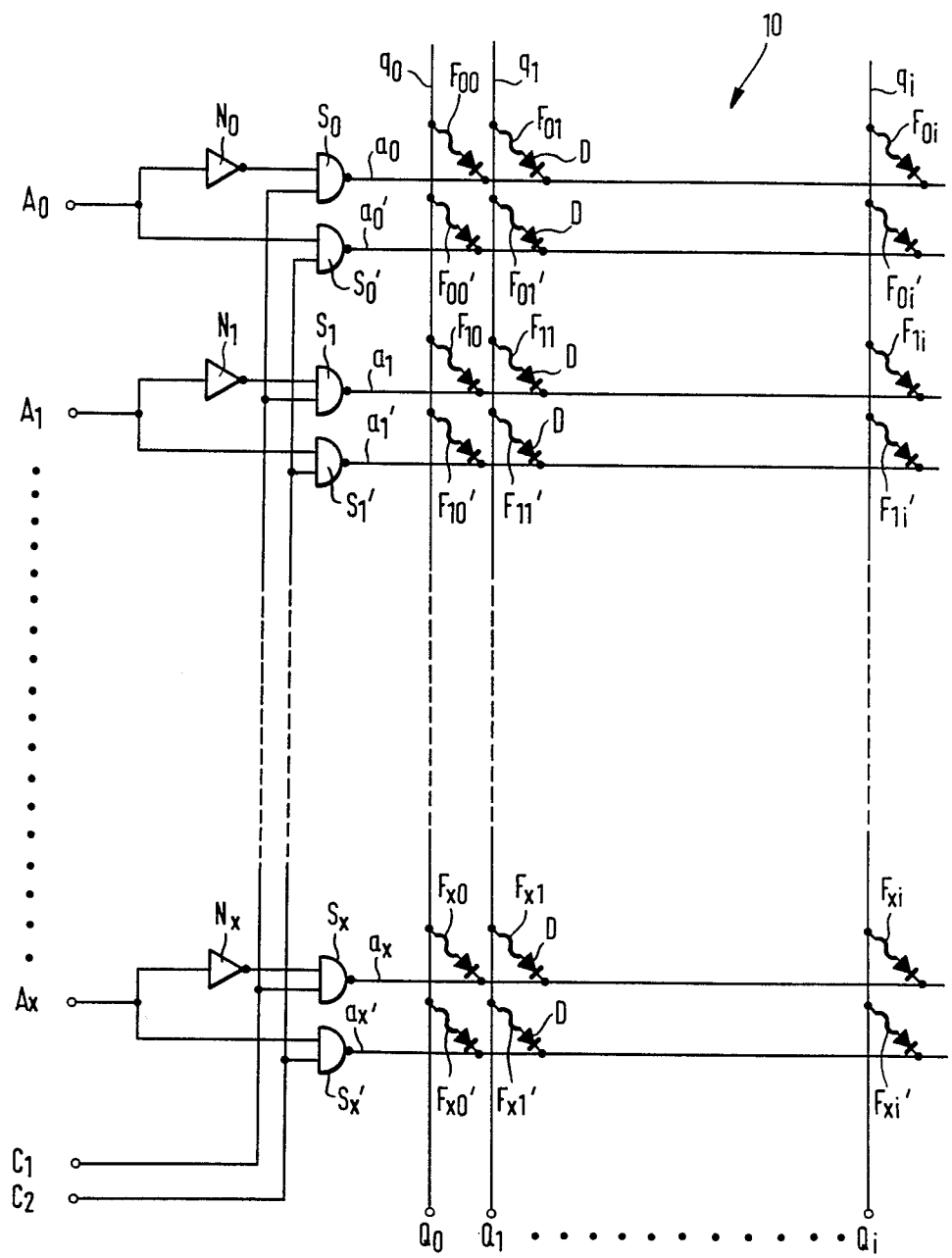

ELECTRICALLY PROGRAMMABLE LOGIC ARRAY

The invention relates to an electrically programmable logic array for binary signals having signal inputs and signal outputs, two row lines for each signal input, the signal applied to the signal input being generatable at the one row line in non-negated form and at the other row line in negated form, a column line for each signal output and a connection between each row line and each column line which is electrically conductive in the non-programmed state and interruptable for the purpose of the programming.

An electrically programmable logic array of the type mentioned at the beginning is contained for example in the integrated circuit of the type SN54TL16R4 made by Texas Instruments. A description of this integrated circuit will be found in the manual issued by this company "ALS/AS Logic Circuit Data Book 1983" on pages 3/10. In English-language literature a logic matrix of this type is generally referred to as "programmable logic array" (abbreviated to PLA). In one use, such a logic array is used in addressing a memory for obtaining a a 1-from-N decoding from the result of which in each case a selection signal is applied to an individual memory address line when a specific memory address associated with said address line appears at an address bus connected to the logic array.

To enable the known logic array to be used as universally as possible two row lines are associated with each signal input and by suitable circuitry measurement is ensured that at the one row line the binary value corresponding to the binary value at the signal input appears whilst at the other row line the negated binary value appears. Via the electrically conductive connections, interruptable for programming purposes, between the row conductor and the column conductors it is thus possible to apply to each column conductor an input signal in non-negated form or also in negated form. In the programmed state, i.e. when some of the originally electrically conductive connections between the row conductors and the column conductors have been interrupted in accordance with the desired decoding function, the column conductors behave like AND circuits, which means that at the output connected to the column conductor a signal with the binary value "H" appears only when this binary value "H" is present at all row conductors connected to said column conductor. As soon as the binary value "L" appears at a row conductor connected to said column conductor the signal at the output connected to said column conductor also assumes the value "L".

Both from the point of view of the manufacturer and from the point of view of the user it is desirable to check a programmable logic array before executing a program to determine whether the electrically conductive connections between the row conductors and the column conductors are all perfect, i.e. are not interrupted. Only when an electrically conductive connection is present in the non-programmed state between each signal input and each signal output is it ensured that the logic array can be programmed in any desired manner to obtain desired decoding functions. With the known logic array it is not possible to check the electrical connections between the row conductors and the column conductors individually because as soon as binary signals are applied to the signal inputs, to each column conductor by the two row conductors associated in each case with a signal input both the binary value "H" and the binary value "L" is applied. Since the circuits which connect the signal inputs to the row conductors are so formed that their output signal assumes the binary value "L" irrespective of their input signal when such a binary value reaches their output from another circuit, at all signal outputs the binary values "L" always occur and these binary values are also applied to the signal inputs. It is therefore not possible to selectively check an electrical connection between a selected row conductor and a selected column conductor.

The problem underlying the invention is to further develop a logic array of the type outlined in such a manner that the electrical connections existing in the non-programmed state between the row conductors and the column conductors can be individually checked prior to programming.

According to the invention this problem is solved in that into the connection between the signal input and each of the row conductors associated with said inputs a controllable switching member is inserted which is controllable by a control signal applied thereto in such a manner that its output signal changes with the signal applied to the associated signal input or irrespective of said signal always retains a predetermined signal value.

In the logic array according to the invention with the aid of the controllable switching members the possibility is provided of generating at all row conductors tne same selected signal value by applying preselected signal values to the signal inputs. One of two switching members associated with a respective signal input is in the state in which its output signal varies in dependence upon the signal applied to the associated signal input. A change of the signal value applied to a signal input can therefore be detected at the signal outputs which are connected via column conductors and the electrically conductive connections to the line conductor at which the changing signal value occurs. It is thereby possible to check consecutively all the electrical connections between the row conductors and column conductors for their functionability. The signal paths between the signal inputs and the associated signal outputs can also be checked both as regards their functionability and as regards their switching speed. The invention will now be explained by way of example with the aid of the drawing, the single FIGURE of which shows a schematic circuit diagram of the part essential to the invention of an electrically programmable logic array.

The invention is illustrated by a single FIGURE

The logic array 10 illustrated in the drawing has signal inputs $A_0$ to $A_x$ and signal outputs $Q_0$ to $Q_i$. Associated with each signal input are two row conductors $a_0$ and $a_0'$, $a_1$ and $a_1'$ . . . $a_x$ and $a_x'$. Its signal output is connected to a column conductor $q_0, q_1 \ldots q_i$.

In the non-programmed state of the logic array 10 between each row conductor $a_o, a_o' \ldots a_x, a_x'$ and each column conductor $q_0$ to $q_1$ an electrically conductive connection formed in each case by a fuse bridge F and a diode D is present. Using circuits not illustrated in the drawing and connected to the column conductors, and by applying specific programming signals, the fuse bridges can be destroyed in selected manner for programming the logic array 10 in order to interrupt the connection between a selected row conductor and a selected column conductor. The manner in which the programming operation is carried out is known and consequently no details thereon will be given here. The diodes D serve for decoupling to "L" and "H" signals at the column conductors $q_0, q_1 \ldots q_i$.

Each signal input $A_0$ to $A_x$ is connected via a negator $N_0$ to $N_x$ to an input of a switching member $S_0, S_1 \ldots S_x$ formed by a NAND circuit. Furthermore, each signal input $A_0$ to $A_x$ is connected directly to an input of a further switching member $S_0', S_1' \ldots S_x'$ likewise formed by a NAND circuit. The second inputs of the switching members $S_0, S_1 \ldots S_x$ are connected directly to a control input $C_1$ and the second inputs of the switching members $S_0', S_1' \ldots S_x'$ are connected jointly to a control input $C_2$.

The following procedure is adopted in order to check in the logic array 10 described whether the fuse bridges F each connecting a row conductor and a column conductor do indeed in fact establish the desired connection:

To the control input $C_1$ a signal with the value "H" is applied and to the control input $C_2$ a signal with the value "L". At the same time signals with the value "H" are applied to all the signal inputs $A_0$ to $A_x$.

For the further explanation the signals at the components $N_0$, $S_0$ and $S_0'$ associated with the signal input $A_0$ and at the row conducts $a_0$ and $a_0'$ will first be considered in detail. The signal with the value "H" at the signal input $A_0$ results, due to the negating by the negator $N_0$, in the signal value "L" appearing at the first input, shown at the top in the drawing, of the switching member $S_0$. At the second input of the switching member $S_0$ there is the already mentioned control signal from the control input $C_1$ with the value "H". Since as already mentioned the switching member $S_0$ is a NAND circuit, and its output connected to the row conductor $a_0$ a signal with the value "H" appears. At both inputs of the switching member $S_0'$ there are signals with the value "L" so that this switching member as well also furnishes at its output a signal with the value "H" and applies it to the row conductor $a_0'$. By application of this signal with the value "L" to the second input of the switching member $S_0'$ the latter furnishes at its output the signal value "H" irrespective of which signal is applied to its first input by the signal input $A_0$. This means that at the row conductor $a_0'$ there is always the signal value "H" irrespective of the signal at the signal input $A_0$.

On the other hand, at the second input of the switching member $S_0$ there is the signal value "H" and as a result at its output and thus also at the row conductor $a_0$ the signal value "H" or the signal value "L" can be generated depending on whether the signal value "H" or "L" is applied to the signal input $A_0$. The conditions outlined above are also present at the components associated with the other signal inputs $A_1$ to $A_x$ and at the corresponding row conductors.

As apparent from the circuit diagram the outputs of all the switching members $S_0, S_0'$ to $S_x, S_x'$ are connected via the fuse bridges $F_{00}, F_{00}$ to $F_{x0}, F_{x0}$ in parallel to the signal output $Q_0$. As long as the signal value "H" is also present at all the row conductors the signal value "H" appears at this output $Q_0$. However, as soon as the signal value "L" appears at one row conductor the signal at the signal output $Q_0$ also assumes the value "L". From the point of view of the logic function the outputs of the switching members $S_0, S_0'$ to $S_x, S_x'$ are each connected via an AND circuit to the signal outputs $Q_0$ to $Q_i$.

For checking the function state of the fuse bridge $F_{00}$ the signal at the signal input $A_0$ is switched from the signal value "H" to the signal value "L". If the signal at the signal output $Q_0$ follows this change from "H" to "L" the fuse bridge $F_{00}$ is in order, i.e. it establishes a connection between the row conductor $a_0$ and the column conductor $q_0$. It is now possible to determine consecutively whether the same change from "H" to "L" also occurs at the signal outputs $Q_1$ to $Q_i$, it thereby being possible to check in succession the fuse bridges $F_{01}$ to $F_{0i}$. For checking the fuse bridges present between the row conductor $a_1$ and the column conductors $q_0$ to $q_i$ a signal with the value "L" is applied only to the signal input $A_1$ and it is determined whether the resulting change from "H" to "L" also occurs at the outputs $Q_0$ to $Q_i$. In this manner, in succession it is possible to check for their satisfactory state all the fuse bridges present between the row conductors $a_0$ to $a_x$ and the column conductors $q_0$ to $q_i$.

For checking the fuse bridges between the row conductors $a_0'$ to $a_x'$ and the column conductors $q_0$ to $q_i$ the signal value "L" is applied to the control input $C_1$ and the signal value "H" is applied to the signal input $C_2$. As in the test previously described at all signal inputs $A_0$ to $A_x$ signals with the value "H" are again applied. As a result, at all row conductors signals with the value "H" are applied. However, in this case the switching members $S_0$ to $S_x$ by the control signal with the value "L" at their second input are put into a state in which their output signal always retains the value "H" irrespective of the value of the signal applied to their first input. In contrast the switching members $S_0'$ and $S_x'$ react to a change of the signal value at their first input from "H" to "L" with a corresponding change of their output signal. In the manner described above it is now possible to check in succession the fuse bridges present between the row conductors $a_0'$ and $a_x'$ and the column conductors $q_0$ to $q_i$ by switching over the signal values at the signal inputs $A_0$ to $A_x$ from "H" to "L" and detecting a corresponding signal value change at the signal outputs $Q_0$ to $Q_i$.

By inserting the switching members $S_0, S_0'$ to $S_x, S_x'$ into the connections between the signal inputs $A_0$ to $A_x$ and the row conductors $a_0, a_0'$ to $a_x, a_x'$ it is possible in the manner outlined to check the conductive state of all the fuse bridges present in the unprogrammed state between the row conductors and the column conductors $q_0$ to $q_i$. This function test provides the user with the certainty that before programming he has at his disposal a perfect logic array 10 so that by the programming carried out by selective interruption of the fuse bridges the desired function of the logic array can indeed be achieved. When using the logic array in the programmed state, to the control inputs $C_1$, $C_2$ signals with the value "H" are applied by which the switching members $S_0, S_0'$ to $S_x, S_x'$ are put into the state in which they vary their output signal in dependence upon the signal applied to their first input.

What is claimed is:

1. Electrically programmable binary logic array having signal inputs and signal outputs, comprising in combination two row lines for each signal input, means for generating the signal input at the one row line in true form and at the other row line in complement form, a column line for each signal output, a connection between each row line and each column line which is electrically conductive in the non-programmed state and interruptable for the purpose of the programming, a controllable switching member between the signal inputs and each of the row conductors, and means for applying a control signal thereto in such a manner that its output signal changes with the signal applied to the associated signal input or irrespective of said signal always retains a predetermined signal value.

2. Logic array according to claim 1, characterized in that the switching members are NAND circuits which have two inputs, of which in each case one is connected to the associated signal input and the other is connected to one of two control inputs.

* * * * *